United States Patent
Han et al.

(10) Patent No.: US 10,998,395 B2
(45) Date of Patent: May 4, 2021

(54) ORGANIC LIGHT-EMITTING DISPLAY DEVICE

(71) Applicant: LG Display Co., Ltd., Seoul (KR)

(72) Inventors: Joon-Soo Han, Goyang-si (KR); Im-Kuk Kang, Paju-si (KR); Jung-Woo Ha, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/660,183

(22) Filed: Oct. 22, 2019

(65) Prior Publication Data

US 2020/0135838 A1    Apr. 30, 2020

(30) Foreign Application Priority Data

Oct. 31, 2018    (KR) .................. 10-2018-0132470

(51) Int. Cl.
    *H01L 27/32*    (2006.01)
    *H01L 51/52*    (2006.01)
    *H01L 51/10*    (2006.01)

(52) U.S. Cl.
    CPC ...... *H01L 27/3279* (2013.01); *H01L 27/3246* (2013.01); *H01L 27/3248* (2013.01);
    (Continued)

(58) Field of Classification Search
    CPC ............ H01L 27/3279; H01L 27/3246; H01L 27/3258; H01L 51/5228; H01L 51/105;
    (Continued)

(56) References Cited

U.S. PATENT DOCUMENTS

| | | | | |
|---|---|---|---|---|
| 2005/0051776 A1* | 3/2005 | Miyagi | ................ | G09G 3/3233 257/72 |
| 2015/0090989 A1* | 4/2015 | Matsumoto | ......... | H01L 51/5228 257/40 |

(Continued)

FOREIGN PATENT DOCUMENTS

CN      103311265 B    5/2016

OTHER PUBLICATIONS

European Search Report dated Feb. 25, 2020 issued in corresponding Patent Application No. 19205524.2 (9 pages).

*Primary Examiner* — Ahmed N Sefer
(74) *Attorney, Agent, or Firm* — Polsinelli PC

(57) ABSTRACT

An organic light-emitting display device comprises a substrate comprising a plurality of sub-pixels, each of the sub-pixels having an emission area and a non-emission area provided to surround the emission area; an auxiliary line disposed in the non-emission area; a first insulating film having a first hole configured to expose a portion of the auxiliary line; an auxiliary line connection pattern disposed on the first insulating film having a protruding portion protruding towards a center of the first hole and overlapping the auxiliary line; at least one bump disposed on the auxiliary line within the first hole and adjacent to the protruding portion of the auxiliary line connection pattern; and a bank having a second hole larger than the first hole to expose the protruding portion of the auxiliary line connection, thereby lowering resistance of a cathode covering a plurality of sub-pixels and preventing lateral current leakage between the sub-pixels through a change of the connection structure between the auxiliary line and the cathode.

21 Claims, 17 Drawing Sheets

(52) U.S. Cl.
CPC ...... *H01L 27/3251* (2013.01); *H01L 27/3258* (2013.01); *H01L 27/3276* (2013.01); *H01L 51/5228* (2013.01); *H01L 51/5281* (2013.01); *H01L 51/105* (2013.01)

(58) Field of Classification Search
CPC ............. H01L 27/3276; H01L 27/3248; H01L 27/3251; H01L 51/5281
See application file for complete search history.

(56) References Cited

U.S. PATENT DOCUMENTS

| | | | |
|---|---|---|---|
| 2015/0097171 A1* | 4/2015 | Kim | H01L 27/326 |
| | | | 257/40 |
| 2016/0013438 A1* | 1/2016 | Im | H01L 51/56 |
| | | | 257/40 |
| 2016/0149156 A1* | 5/2016 | Kim | H01L 27/3246 |
| | | | 257/40 |
| 2016/0293888 A1* | 10/2016 | Shim | H01L 51/5228 |
| 2017/0062755 A1* | 3/2017 | Im | H01L 51/5228 |
| 2017/0125725 A1* | 5/2017 | Paek | H01L 51/0022 |
| 2017/0330513 A1* | 11/2017 | Hong | H01L 27/3276 |
| 2018/0006106 A1* | 1/2018 | Oh | H01L 27/3262 |
| 2018/0006264 A1* | 1/2018 | Lee | H01L 27/3246 |
| 2018/0097047 A1 | 4/2018 | Jung et al. | |
| 2018/0122877 A1* | 5/2018 | Beak | H01L 27/3262 |
| 2018/0151647 A1* | 5/2018 | Lee | H01L 27/3246 |
| 2018/0151831 A1* | 5/2018 | Lee | H01L 27/3223 |
| 2018/0190934 A1* | 7/2018 | Choi | H01L 27/3246 |

\* cited by examiner

Degradation

ORGANIC LIGHT-EMITTING DISPLAY DEVICE

CROSS REFERENCE TO RELATED APPLICATION

This application claims the priority of Korean Patent Application No. 10-2018-0132470, filed on Oct. 31, 2018, which is hereby incorporated by reference in its entirety.

BACKGROUND

Field of the Disclosure

The present disclosure relates to an organic light-emitting display device, and more particularly to an organic light-emitting display device that further includes an auxiliary line to lower resistance of a cathode covering a plurality of sub-pixels and that is capable of effectively preventing lateral current leakage through a change of the connection structure thereof.

Description of the Background

As the information society develops, display devices for displaying an image are being increasingly required in various forms, and in recent years, various display devices such as liquid crystal display (LCD) devices, plasma display panel (PDP) devices, organic light-emitting display (OLED) devices, organic electroluminescent display devices, or the like have been utilized. Such a display device includes a display panel corresponding to the display device.

Among these, an organic light-emitting display device is a self-luminous device and thus does not a separate light source unit, giving it the advantage of being easily used in slim or flexible display devices or having excellent color purity.

The organic light-emitting display device includes an organic light-emitting diode (OLED) to emit light. The organic light-emitting diode includes two different electrodes and an emission layer disposed between the electrodes. An electron generated in any one of the electrodes and a hole generated in the other one of the electrodes are injected into the emission layer, and an exciton is formed by combination of the electron and the hole at the emission layer. When the exciton transitions from an excited state to a ground state, light is emitted from the organic light-emitting diode.

An organic light-emitting display device, in which each of a plurality of sub-pixels defined on a substrate in a matrix form includes an organic light-emitting diode and a driving thin-film transistor for controlling the organic light-emitting diode, is referred to as an active-type organic light-emitting display device.

In the active-type organic light-emitting display device, the organic light-emitting diode includes first and second electrodes, which face each other, and an organic light-emitting layer disposed therebetween. The first electrode is patterned in each pixel, and the second electrode is formed in an integral structure covering a plurality of sub-pixels.

However, a conventional organic light-emitting display device, which has a rectangular shape in a plan view, has nonuniform brightness from one side thereof to the opposite side thereof. Specifically, the brightness at the center between the opposite sides is the lowest, and is gradually increased from the center to the periphery, i.e. to the one side or to the opposite side. In other words, the brightness is gradually decreased from the periphery to the center.

In the organic light-emitting display device, the organic light-emitting diode includes a second electrode (a cathode) covering a plurality of sub-pixels. The second electrode is formed of a material having high resistance characteristics, which is one of causes of brightness nonuniformity. Constant voltage or ground voltage is applied to the peripheral portion of the second electrode. However, the resistance is gradually increased from the peripheral portion, i.e. from a voltage supply source, to the center portion, and voltage stability is deteriorated. Thus, a brightness deviation occurs in the respective areas of the panel.

Further, because the brightness deviation of the display device gives a sense of discomfort to a viewer, the improvement of brightness deviation is required.

SUMMARY

Accordingly, the present disclosure is directed to an organic light-emitting display device that substantially obviates one or more problems due to limitations and disadvantages of the related art.

More specifically, the present disclosure is to provide an organic light-emitting display device that further includes an auxiliary line to lower resistance of a cathode covering a plurality of sub-pixels and that is capable of effectively preventing lateral current leakage through a change of the connection structure thereof.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

An organic light-emitting display device according to the present disclosure further includes an auxiliary line in order to lower resistance of a cathode covering a plurality of sub-pixels, and is capable of effectively preventing lateral current leakage through a change of the connection structure thereof.

According to an aspect of the present disclosure, an organic light-emitting display device comprises: a substrate comprising a plurality of sub-pixels, each of the sub-pixels having an emission area and a non-emission area provided to surround the emission area; an auxiliary line in the non-emission area of the substrate; a first insulating film having a first hole configured to expose a portion of the auxiliary line; an auxiliary line connection pattern on the first insulating film having a protruding portion protruding towards an interior or center of the first hole and overlapping the auxiliary line; at least one bump on the auxiliary line within the first hole and adjacent to the protruding portion of the auxiliary line connection pattern; and a bank having a second hole larger than the first hole to expose the protruding portion of the auxiliary line connection pattern.

The organic light-emitting display device may further comprise a cathode configured to be directly connected to the auxiliary line in a space under the protruding portion of the auxiliary line connection pattern.

The organic light-emitting display device may further comprise an organic film between the cathode and the bank.

The organic light-emitting display device may further comprise: an anode in a same layer as the auxiliary line connection pattern and an organic functional layer in a same layer as the organic film, in the emission area.

The anode, the organic functional layer and the cathode may be sequentially stacked in the emission area to form an organic light-emitting diode.

The organic light-emitting display device may further comprise: an organic film on an upper surface of the at least one bump. The organic film may be formed in an island shape.

The at least one bump may include a material of the first insulating film.

According to an aspect, the at least one bump has a smaller height than the first insulating film.

According to an aspect, the at least one bump has a same height as the first insulating film. The organic light-emitting display device may further comprise: at least one auxiliary electrode divergence portion diverging from the auxiliary line connection pattern and being provided on at least one of the at least one bump. The at least one auxiliary electrode divergence portion may laterally protrude from an upper surface of the at least one bump.

The auxiliary line connection pattern may comprise a further divergence portion located at a side of the first hole other than the sides surrounded by the auxiliary line connection pattern.

The auxiliary line connection pattern may have a connection portion with the auxiliary line. The connection portion may be provided in a region overlapping the bank.

The organic light-emitting display device may further comprise: a second insulating film between the first insulating film and the bank. The second insulation film may have a third hole exposing the connection portion and the first hole.

The first insulating film may be an inorganic film. The second insulating film may be an organic film.

The organic light-emitting display device may comprise a plurality of bumps spaced apart from each other within the first hole.

At least one of the at least one bump may be laterally spaced apart from the auxiliary line connection pattern within an interval of 5 μm.

An organic light-emitting display device according to the present disclosure includes a substrate including a plurality of sub-pixels, each of the sub-pixels including an emission area and a non-emission area formed around the emission area, an auxiliary line disposed in the non-emission area of the substrate, a first insulating film having therein a first hole exposing a portion of the auxiliary line therethrough, an auxiliary line connection pattern disposed on the first insulating film, the auxiliary line connection pattern having a protruding portion, at least a portion of the protruding portion protruding to the interior of the first hole and overlapping the auxiliary line with a vertical spacing from the auxiliary line, at least one bump disposed on the auxiliary line within the first hole, the bump being located adjacent to the protruding portion of the auxiliary line connection pattern, and a bank having therein a second hole exposing the protruding portion of the auxiliary line connection pattern therethrough, the second hole being larger than the first hole.

The organic light-emitting display device may further include a cathode configured to be directly connected to the auxiliary line within a horizontal spacing between the protruding portion of the auxiliary line connection pattern and the bump.

The organic light-emitting display device may further include an organic film disposed between the cathode and the bank.

The organic light-emitting display device may further include an anode disposed in the same layer as the auxiliary line connection pattern and an organic functional layer disposed in the same layer as the organic film in the emission area, and the anode, the organic functional layer and the cathode may be sequentially stacked in the emission area to form an organic light-emitting diode.

The bump may be formed of a material forming the first insulating film.

The bump may have a smaller height than the first insulating film.

The organic light-emitting display device may further include an organic film formed on the upper surface of the bump in an island shape.

The bump may have the same height as the first insulating film.

The organic light-emitting display device may further include an auxiliary electrode divergence portion diverging from the auxiliary line connection pattern, the auxiliary electrode divergence portion being disposed on the bump.

The auxiliary electrode divergence portion may have a protruding portion radially protruding from the upper surface of the bump.

The auxiliary line connection pattern may have a connection portion with the auxiliary line in a region in which the auxiliary line connection pattern overlaps the bank.

The organic light-emitting display device may further include a second insulating film disposed between the first insulating film and the bank, the second insulating film having therein a third hole exposing the connection portion and the first hole therethrough.

The first insulating film may be an inorganic film, and the second insulating film may be an organic film.

The at least one bump may include a plurality of bumps, the plurality of bumps being spaced apart from each other within the first hole.

The bump may be horizontally spaced apart from the auxiliary line connection pattern within an interval of 5 μm.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspect(s) of the disclosure and together with the description serve to explain the principle of the disclosure.

In the drawings.

DETAILED DESCRIPTION OF THE DISCLOSURE

Figure 1:
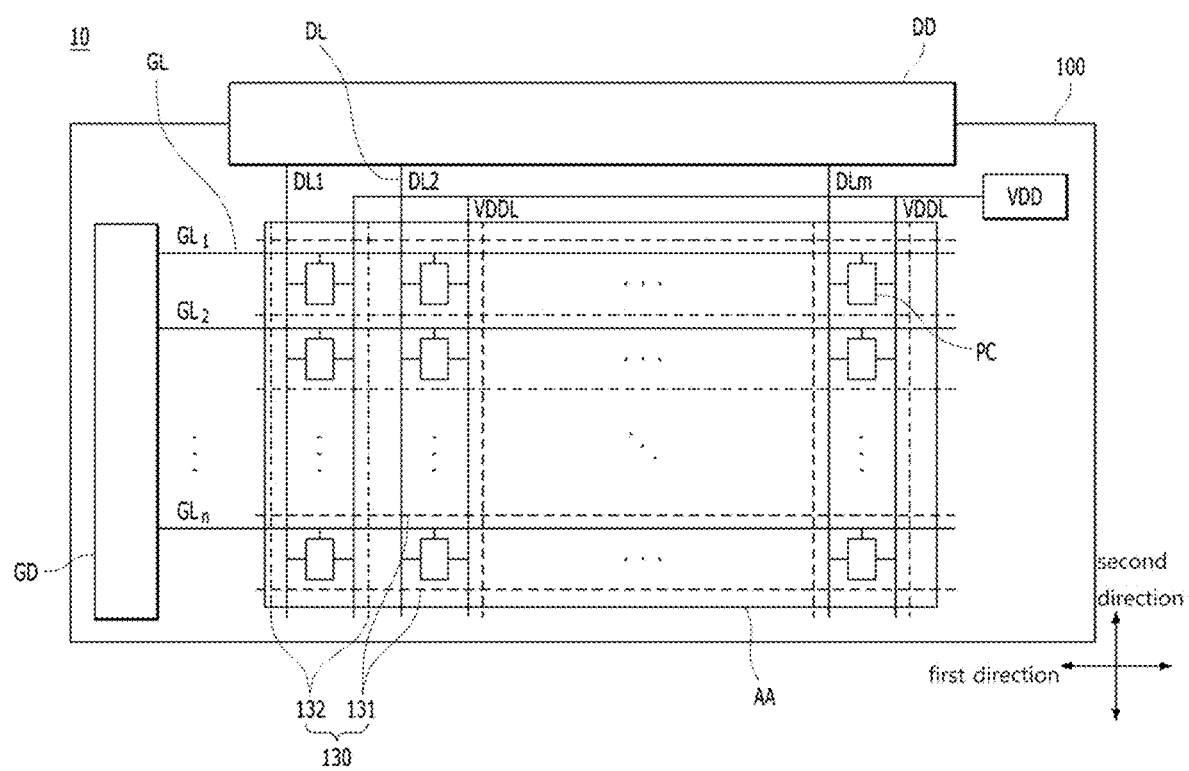
FIG. 1 is a block diagram schematically showing an organic light-emitting display device according to the present disclosure.

Reference will now be made in detail to the exemplary aspects of the present disclosure, examples of which are illustrated in the accompanying drawings.

The exemplary aspects of the present disclosure to be described below are provided by way of example so that the idea of the present disclosure can be sufficiently transferred to those skilled in the art to which the present disclosure pertains. Therefore, the present disclosure is not limited to the exemplary aspects set forth herein but may be modified in many different forms. In the drawings, sizes, thicknesses or the like of elements may be exaggeratedly illustrated for the sake of convenience and clarity. Wherever possible, the same reference numbers will be used throughout the drawings to refer to the same or like parts.

Advantages and features of the present disclosure and methods for achieving them will be made clear from aspects described below in detail with reference to the accompanying drawings. The present disclosure may, however, be embodied in many different forms, and should not be construed as being limited to the aspects set forth herein. Rather, these aspects are provided so that this disclosure will be thorough and complete, and will fully convey the scope of the disclosure to those skilled in the art. The present disclosure is defined only by the scope of the claims. The same reference numerals used throughout the specification refer to the same constituent elements. In the drawings, the sizes of layers or areas and the relative sizes thereof may be exaggerated for clarity of description.

It will be understood that, when an element or a layer is referred to as being "on" another element or layer, it can be directly on the other element or layer or intervening elements or layers may also be present. On the other hand, when an element is referred to as being "directly on" another element, this means that there are no intervening elements or layers therebetween.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions.

The terminology used herein is for the purpose of describing particular aspects only and is not intended to be limiting of the disclosure. As used herein, the singular forms are intended to include the plural forms as well, unless the context clearly indicates otherwise. It will be further understood that the terms "comprises" and/or "comprising," when used in this specification, specify the presence of stated components, steps, operations and/or elements, but do not preclude the presence or addition of one or more other components, steps, operations and/or elements.

Figure 2:
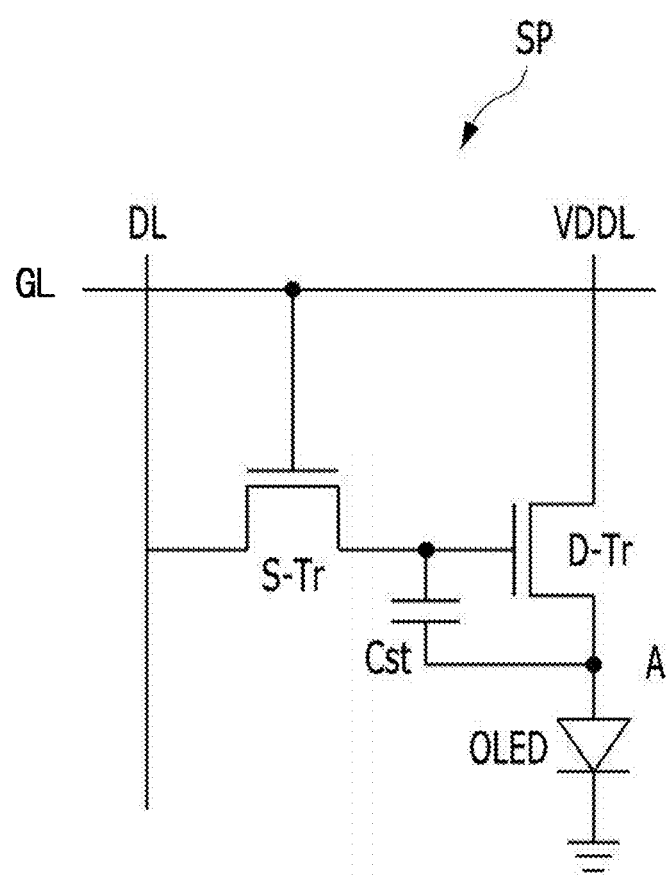
FIG. 2 is a circuit diagram of each sub-pixel in FIG. 1.
Figure 3:
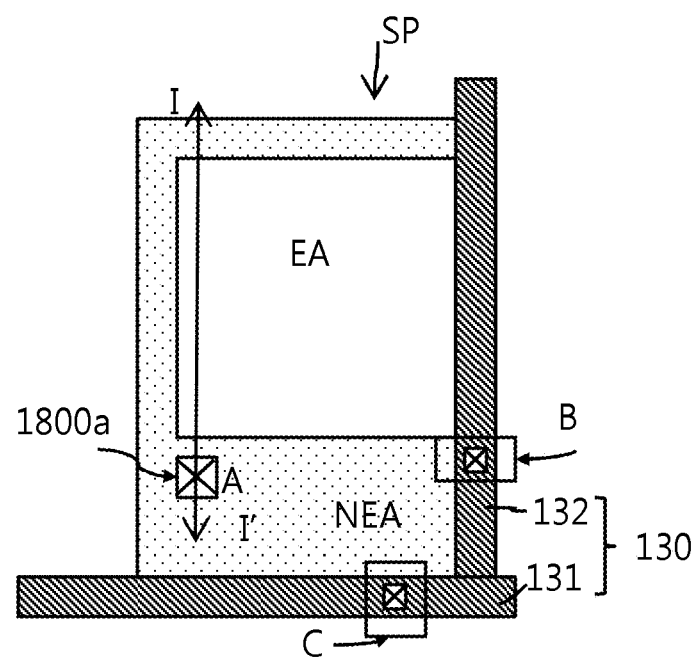
FIG. 3 is a plan view showing each sub-pixel in FIG. 1.

FIG. 1 is a block diagram schematically showing an organic light-emitting display device according to the present disclosure, FIG. 2 is a circuit diagram of each sub-pixel in FIG. 1, and FIG. 3 is a plan view showing each sub-pixel in FIG. 1.

Hereinafter, spaces and areas divided in the organic light-emitting display device according to the present disclosure will now be described with reference to FIGS. 1 to 3 in order to understand the configuration shown in the cross-sectional views described below.

As shown in FIGS. 1 to 3, the organic light-emitting display device 10 according to the present disclosure includes a substrate 100, which has a polygonal shape or a rectangular shape, and various components disposed on the substrate 100.

The substrate 100 is largely divided into a display area AA formed at the center thereof and a peripheral area formed around the display area. Sub-pixels SP, each of which includes an emission area EA and a non-emission area NEA formed around the emission area, are arranged within the display area AA in a matrix form.

Each sub-pixel SP is divided into a gate line GL and a data line DL, which cross each other. A driving voltage line VDDL, to which driving voltage is applied, is further provided within the display area AA in the same direction as the data line in order to drive a pixel circuit PC provided in each sub-pixel SP. The driving voltage line is connected to a driving thin-film transistor D-Tr, which is a part of the pixel circuit PC.

The pixel circuit PC connected to the above lines will be described below with reference to FIG. 2. The pixel circuit PC includes a switching thin-film transistor S-Tr disposed at a point where the gate line GL and the data line DL cross each other, a driving thin-film transistor D-Tr disposed between the switching thin-film transistor S-Tr and the driving voltage line VDDL, an organic light-emitting diode OLED connected to the driving thin-film transistor D-Tr, and a storage capacitor Cst disposed between a gate electrode and a drain electrode (or a source electrode) of the driving thin-film transistor D-Tr.

Here, the switching thin-film transistor S-Tr is formed at an area where the gate line GL and the data line DL cross each other and functions to select a corresponding sub-pixel. The driving thin-film transistor D-Tr functions to drive the organic light-emitting diode OLED of the sub-pixel selected by the switching thin-film transistor S-Tr.

A gate driving part GD for supplying a scan signal to the gate line GL and a data driving part DD for supplying a data signal to the data line DL are included in the peripheral area. The driving voltage line VDDL may receive driving voltage from a first power source VDD provided in the peripheral area or may receive driving voltage via the data driving part DD.

Here, the gate driving part GD, the data driving part DD and the first power source VDD may be formed so as to be directly embedded in the peripheral area on the substrate 100 when the thin-film transistor of the display area is formed, or may be attached to the peripheral area on the substrate 100 in a separate film or printed circuit board form. In any case, these circuit driving parts are disposed in the peripheral area around the display area. To this end, the display area AA is formed further inwards than the edge of the substrate 100.

The gate driving part GD sequentially supplies scan signals to a plurality of gate lines GL. For example, the gate driving part GD is a control circuit, and supplies scan signals to a plurality of gate lines GL in response to control signals supplied from a timing controller (not shown).

The data driving part DD supplies data signals to data lines DL1 to DLm selected from the data lines DL in response to control signals supplied from an external device such as a timing controller (not shown). The data signals supplied to the data lines DL1 to DLm are supplied to the sub-pixels SP selected by the scan signals whenever the scan signals are supplied to the gate lines GL to GLn. Through this process, the sub-pixels SP are charged with voltage corresponding to the data signals and emit light with brightness corresponding thereto.

The substrate 100 may be an insulating substrate, which is formed of plastic, glass, ceramic, or the like. In the case in which the substrate 100 is formed of plastic, the substrate 100 may be reduced in thickness and may be flexible. However, the material of the substrate 100 is not limited thereto. The substrate 100 may include metal and may further include an insulating buffer layer provided at a portion thereof on which lines are formed.

A plurality of sub-pixels SP, e.g. three or four sub-pixels, which emit light beams having different colors from each other, may be grouped into a pixel.

Each of the sub-pixels SP is a unit, in which a specific kind of color filter is provided or in which the organic light-emitting diode is capable of emitting a light beam having a specific color without a color filter. Colors defined by the sub-pixels SP include red R, green G and blue B. De-pending on the aspect, the colors may further include white W. However, the present disclosure is not limited thereto.

The organic light-emitting diode OLED is connected to the driving thin-film transistor D-Tr at a first node A, and includes an anode, a cathode disposed opposite the anode, and an organic emission layer disposed between the anode and the cathode. The anode, the cathode and the organic emission layer being disposed in each sub-pixel.

The organic light-emitting display device 10 may include a top emission type, a bottom emission type and a dual emission type. In any emission type, a display panel having a large area may undergo voltage drop of a cathode which has high resistance, on the front surface of the display area AA. Therefore, in order to solve this, the present disclosure is configured such that an auxiliary electrode or an auxiliary line 130 is disposed in the non-emission area, as shown in FIG. 3.

Here, the auxiliary line 130 is formed of metal in the same layer as the data line DL. The auxiliary line 130, which has high conductivity, is connected to the cathode at contact portions (refer to nodes B shown in FIG. 4) in each sub-pixel or each pixel, thereby lowering the resistance of the cathode in the extending direction of the auxiliary line 130 and consequently preventing voltage drop of the cathode, which differs in the respective areas.

In the illustrated aspect, the auxiliary line 130 includes a first line 131, which extends in the direction of the gate line GL, and a second line 132, which extends in the direction of the data line DL, without limitation thereto. The auxiliary line 130 may be disposed only in one of these directions.

The auxiliary line 130, as described above, may be patterned in the same layer as the data line DL, i.e. in the same layer as one electrode constituting the thin-film transistor. The auxiliary line 130 may be formed in a single layer structure made of Cu, Mo, Al, Ag, or Ti, or may be formed in a multi-layer structure made of combinations thereof. The auxiliary line 130 is connected to the cathode at the second nodes B and functions to lower the resistance of the cathode.

Hereinafter, examples of a top-emission-type organic light-emitting display device will be described below. However, the aspects of the present disclosure are not limited to the top emission type, but may be applied to the structures of any display devices capable of preventing voltage drop of a cathode.

Each of the aspects to be described below includes a display area AA, in which sub-pixels SP, each including an emission area EA and a non-emission area NEA disposed around the emission area, are arranged in a matrix form, a substrate 100 having a peripheral area formed around the display area AA, a driving thin-film transistor D-Tr provided in each sub-pixel SP on the substrate, and an organic light-emitting diode OLED, which is connected to the driving thin-film transistor D-Tr through a first contact hole 1800a at a first node A. A cathode of the organic light-emitting diode is connected to auxiliary lines 130 (131 and 132) of the non-emission area NEA at second nodes B. The cathode may be connected to one of the auxiliary lines 131 or 132, which extends in one direction, or may be connected to both the auxiliary lines 131 and 132, which extend in two directions.

The concrete connection structure between the cathode and the auxiliary line 130 in each of the aspects will be described below.

Figure 4:
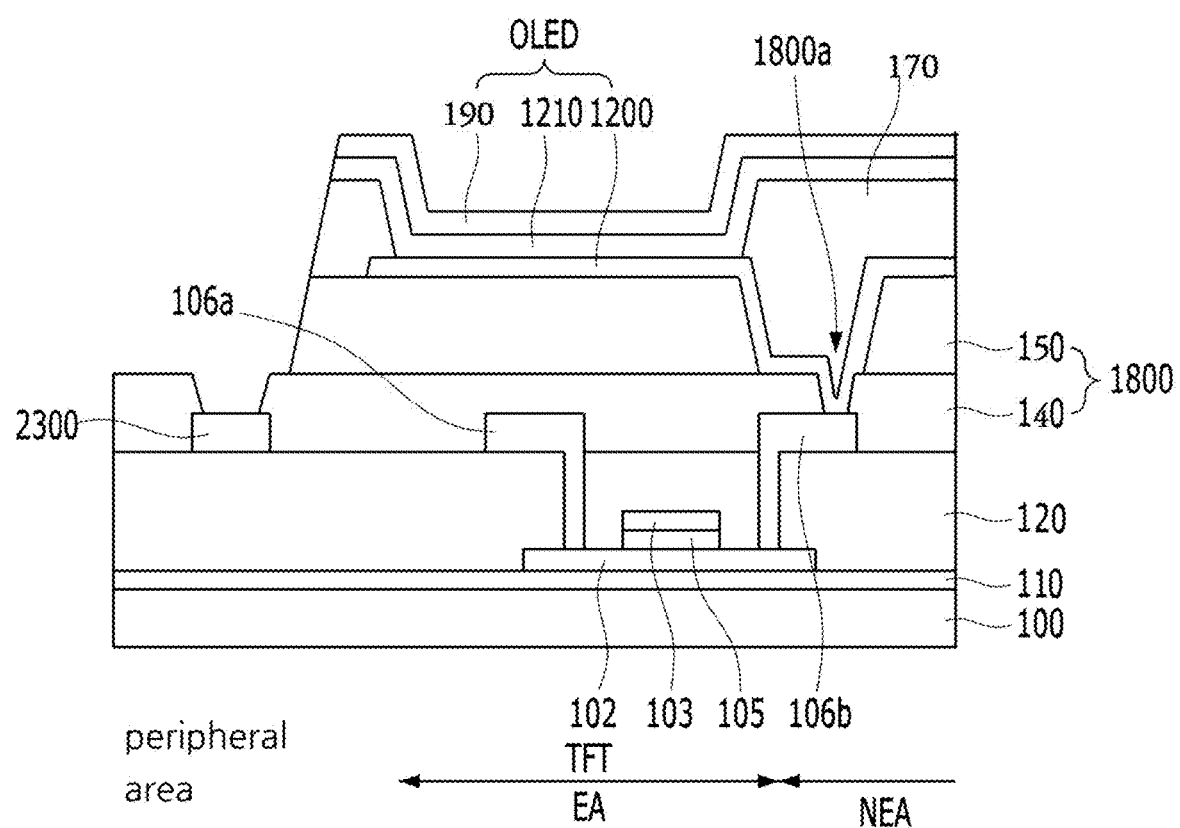
FIG. 4 is a cross-sectional view taken along line I-I' in FIG. 3.

FIG. 4 is a cross-sectional view taken along line I-I' in FIG. 3.

As shown in FIG. 4, the emission area of the organic light-emitting display device according to the present disclosure includes an organic light-emitting diode OLED, which includes an anode 1200, an organic functional layer 1210 and a cathode 190, which are stacked in that order on the substrate 100.

The anode 1200 includes a transparent electrode, such as ITO, IZO or ITZO, which is in contact with the organic functional layer 1210. Depending on the aspect, the anode 1200 may further include a reflective electrode provided at a lower side thereof.

The organic functional layer 1210 is a layer that emits light. Although the organic functional layer 1210 is illustrated as being formed in a single layer structure, it is not limited thereto, but may have a multi-layer stack structure.

For example, the organic functional layer 1210 may have a structure in which a hole injection layer, a hole transport layer, an emission layer, an electron transport layer and an electron injection layer are stacked on one another. Depending on the aspect, the organic functional layer may be formed in a tandem structure, which includes a plurality of emission units, each of which includes an emission layer, a hole transport layer disposed on the lower side of the emission layer and an electron transport layer disposed on the upper side of the emission layer, and a charge generation layer interposed between the emission units.

Here, in the case in which the organic functional layer is formed in a multi-layer structure, the entire multiple layers or some of the multiple layers may be commonly provided in the sub-pixels. Even in this case, according to the organic light-emitting display device according to the present disclosure, because the auxiliary line 130 and the cathode 190 are directly connected to each other, a portion in which the organic functional layer is not formed needs to be present in the auxiliary line 130. According to the present disclosure, the portion in which the organic functional layer is not formed is realized through an undercut structure, and the concrete shape of the undercut structure in each of the aspects will be described later.

The emission area EA of the present disclosure may be defined as an open area of a bank 170. The bank 170 may be formed of polyimide, polyacrylate or polyamide, and may be patterned through exposure and development processes. Depending on the aspect, the bank 170 may include a light-blocking material to prevent light leakage or mixing of colors of light emitted from adjacent sub-pixels.

As described above, in the pixel circuit, the anode 1200 of the organic light-emitting diode OLED is connected to the (driving) thin-film transistor TFT at the first node A.

The driving thin-film transistor TFT includes a semiconductor layer 102 disposed on the substrate 100, a gate insulating film 105 and a gate electrode 103, which overlap a predetermined portion of the semiconductor layer 102, and a source electrode 106a and a drain electrode 106b, which are connected to opposite ends of the semiconductor layer 102.

The semiconductor layer 102 may include, for example, any one of an amorphous silicon layer, a polysilicon layer, and an oxide semiconductor layer. Depending on the aspect, the semi-conductor layer 102 may include a combination of two or more of the semiconductor layers described above.

In order to prevent the semiconductor layer 102 from being affected by impurities of the substrate 100, a buffer layer may be additionally provided between the substrate 100 and the semi-conductor layer 102.

In addition, an interlayer insulating film 120, which has a connection hole of the connection part, may be additionally provided between the semiconductor layer 102 and the source electrode 106a and between the semiconductor layer 102 and the drain electrode 106b.

In addition, an insulation stack 1800 having therein a first contact hole 1800a may be provided between the driving thin-film transistor TFT and the anode 1200. In the aspect shown in FIG. 4, the insulation stack 1800 includes a first insulating film 140, which is of an inorganic film type, and a second insulating film 150, which is of an organic film type. In this case, the first contact hole 1800a in the insulation stack 1800 is formed such that the second insulating film 150 and the first insulating film 140 are partially removed in order to expose the drain electrode 106b.

However, the present disclosure is not limited thereto. Only the first insulating film 140 may be formed in the insulation stack 1800 without forming the second insulating film 150, which is an organic film.

In addition, a pad electrode 2300 may be additionally provided in the same layer as the source electrode 106a and the drain electrode 106b in the peripheral area of the substrate 100. In addition, a pad protection electrode may be additionally provided in the same layer as the anode 1200 above the pad electrode 2300.

The construction of the emission area described above is commonly included in the aspects of the organic light-emitting display device according to the present disclosure. Hereinafter, the construction above the auxiliary line provided in the non-emission area NEA in each of the aspects will be described.

Figure 5:
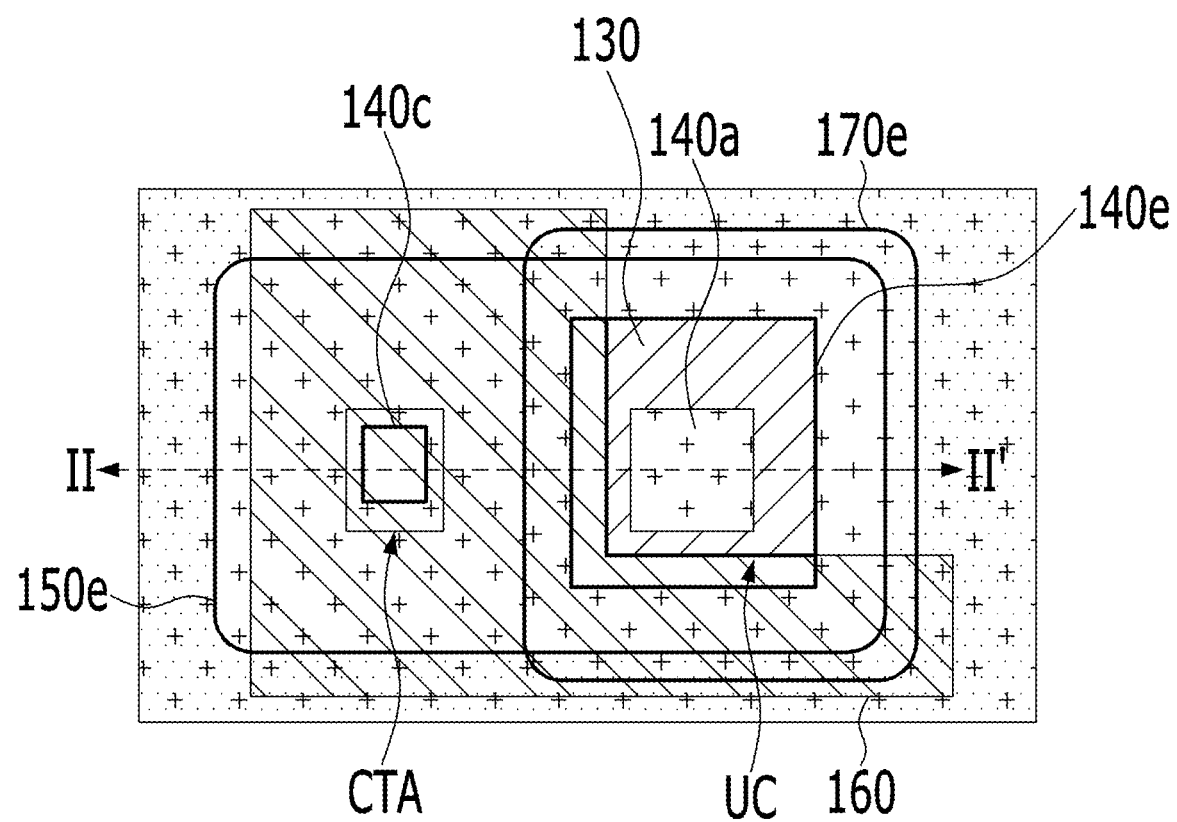
FIG. 5 is an enlarged view of region B or region C in FIG. 3 in relation to an organic light-emitting display device according to a first aspect of the present disclosure.
Figure 6:
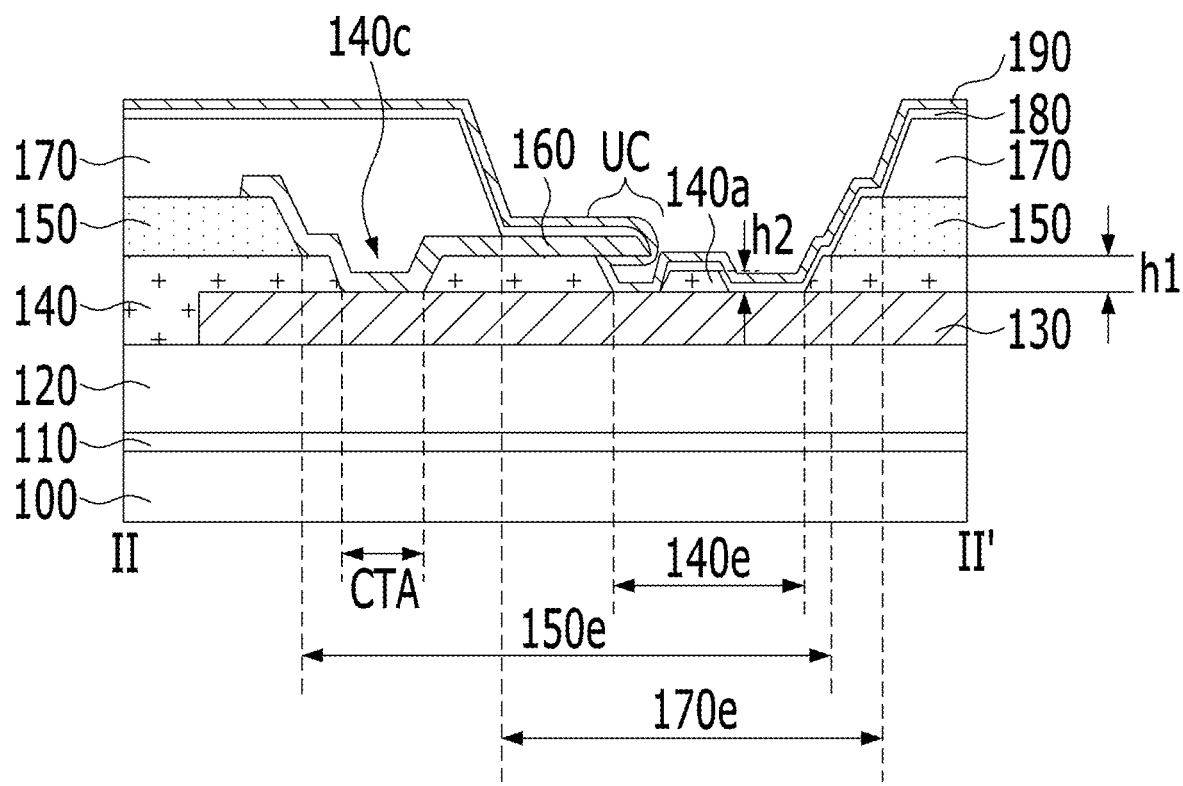
FIG. 6 is a cross-sectional view taken along line II-II' in FIG. 5.

FIG. 5 is an enlarged view of region B or region C in FIG. 3 in relation to an organic light-emitting display device according to a first aspect of the present disclosure, and FIG. 6 is a cross-sectional view taken along line II-II' in FIG. 5.

As shown in FIGS. 5 and 6, the organic light-emitting display device according to the first aspect of the present disclosure includes an auxiliary line 130, which is provided in the non-emission area of the substrate 100, a first insulating film 140, which has therein a first hole 140e for exposing a portion of the auxiliary line, an auxiliary line connection pattern 160, which is disposed on the first insulating film 140 and has a protruding portion UC protruding therefrom to the interior or center of the first hole 140e so as to overlap the auxiliary line 130 with a vertical spacing from the auxiliary line 130, a bump 140a, which is disposed on the auxiliary line 130 within the first hole 140e so as to be adjacent to the protruding portion UC of the auxiliary line connection pattern 160, and a bank 170, which exposes the protruding portion of the auxiliary line connection pattern 160 therethrough and has therein a second hole 170e, which is larger than the first hole. In other words, the protruding portion UC may protrude from a side or edge of the first hole 140e formed in the first insulation film 140e. In other words, the vertical spacing or vertical space may be formed between the protruding portion UC and the auxiliary line 130. That is, a height of the vertical space may correspond to a height of the first insulating film 140. In other words, the bump 140a may be laterally or horizontally spaced apart from a side or edge of the first hole 140e formed in the first insulating film and may be provided neighboring or in close proximity to the line connection pattern 160.

The bank 170 and the first insulating film 140 are the components that extend horizontally and continuously from the emission area described above with reference to FIG. 4. In addition, like the emission area, a second insulating film 150 may be additionally provided as a protection film, which is of an organic film type, between the first insulating film 140 and the bank 170.

The auxiliary line 130 is formed in the same layer as the source electrode 106a and the drain electrode 106b described above with reference to FIG. 4. For example, the auxiliary line 130 may be formed in a single layer structure made of Cu, Mo, Al, Ag, or Ti, or may be formed in a multi-layer structure made of combinations thereof.

The auxiliary line connection pattern 160 is formed in the same layer as the anode 1200 and includes a transparent electrode. The auxiliary line connection pattern 160 is formed so as to be electrically disconnected from the anode 1200, and may be formed in an island shape in each sub-pixel. In other words, the auxiliary line connection pattern 160 is formed to be disconnected from the anode 120 in each sub-pixel. In addition, the auxiliary line connection pattern 160 has an auxiliary line contact CTA through a second contact hole 140c, which is formed in the first insulating film 140 in order to expose a portion of the auxiliary line 130. The auxiliary line 130, which is a transparent electrode element formed in the same layer as the anode 1200, may maintain low resistance characteristics within a corresponding sub-pixel through the auxiliary line contact CTA, which may be or include a metallic element, a metallic layer, a reflective element and/or a reflective layer. In other words, the auxiliary line contact CTA may provide or be a connection portion for electrically connecting the auxiliary line connection pattern 160 to the first insulating film 140.

The reason why the auxiliary line connection pattern 160 of the present disclosure has the protruding portion UC, which is disposed further inwards than the first insulating film 140, is to allow the cathode 190, which is to be formed later, to be directly connected to the auxiliary line 130 within the vertical spacing between the protruding portion UC of the auxiliary line connection pattern 160 and the auxiliary line 130. The protruding portion UC protrudes from the first insulating film 140 with a width of about 2 to 5 μm in the horizontal direction.

As shown in FIG. 5, the protruding portion UC of the auxiliary line connection pattern 160 is disposed in a region overlapping the first hole 140e. In other words, the protruding portion UC of the auxiliary line connection pattern 160 overlaps the first hole 140e provided in the first insulation film 140. As shown in FIG. 5, the protruding portion may have an "L" shape in a plan view, without limitation thereto. The protruding portion UC may have a "-" shape or an "l" shape corresponding to one side or edge of the first hole 140e, a "U" shape corresponding to three sides or edges of the first hole 140e, or a "□" shape corresponding to four sides or edges of the first hole 140e. The auxiliary line connection pattern 160 is provided so as to surround some or all of the sides or edges of the first hole 140e depending on the shape of the protruding portion.

The protruding portion UC of the auxiliary line connection pattern 160 is a structure that is obtained by etching the first insulating film 140 below the auxiliary line connection pattern 160. This structure is referred to as an undercut structure because the element (the first insulating film) below the auxiliary line connection pattern 160 is partially removed. Thus, a space is formed under the protruding portion UC of the auxiliary line connection pattern 160. That is, the space is formed between the protruding portion UC and the auxiliary line 130, and within the first hole 140e formed in the first insulating film 140. This space may also be referred to as vertical space, vertical spacing.

The bump 140a of the present disclosure is spaced apart from the first insulating film 140, in other words from an edge or side of the first hole 140e formed in the first insulating film 140, and is disposed adjacent to the auxiliary line connection pattern 160. The bump 140a is formed of the same material as the first insulating film 140, and has a height that is equal to or less than the height of the first insulating film 140. In order to allow an organic film 180, which is to be formed later, to be formed along the upper surface and the lateral surface of the bump 140a and to prevent the organic film 180 from extending to a region below the auxiliary line connection pattern 160, in other words to the space under the protruding portion UC, the bump 140a is disposed adjacent to the end of the protruding portion of the auxiliary line connection pattern 160 within an interval of 5 μm. The reason why the bump 140a is disposed adjacent to the auxiliary line connection pattern 160 is to allow the organic film 180, which is formed through a deposition process after the formation of the bank 170, to remain on the upper portion and the lateral portion of the bump 140a and to prevent the organic film 180 from extending to a region below the auxiliary line connection pattern 160, in other words to the space under the protruding portion UC.

As described above, when the organic film 180 is deposited after the formation of the bank 170, the bump 140a functions as a structure within the first hole 140e for reducing or preventing permeation of the organic film 180 under the protruding portion UC of the auxiliary line connection pattern 160. In other words, the bump 140a functions as a structure within the first hole 140e for reducing or preventing permeation of the organic film 180 into the space under the protruding portion UC of the auxiliary line connection pattern 160. The organic film 180 is deposited with strong straightness. Thus, the organic film 180 is deposited with a constant thickness on a flat surface, but is deposited with a small thickness or is hardly deposited on a lateral portion. Thus, an organic material, which is introduced into the first hole 140e, is deposited with a constant thick-ness on the upper surface of the bump 140a and on the flat surface of the auxiliary line 130, on which the bump 140a is not formed, and is deposited with a small thickness on the lateral surface of the bump 140a. In this case, because the surface area is increased by the formation of the bump 140a, the organic material introduced into the first hole 140e is dispersed on the surface of the bump 140a, and thus a small amount or no amount of organic material permeates the space under protruding portion of the auxiliary line connection pattern 160. Further, since the organic film 180 is formed with a small thickness on the lateral surface of the bump 140a, a possibility of permeation of the organic film 180 into the space under the protruding portion of the auxiliary line connection pattern 160 disposed adjacent thereto is also lowered.

In particular, during the process of depositing the multi-layered organic film 180 in the structure in which the bump 140a of the present disclosure is provided, even when a portion of the material of the organic film 180 permeates the space under the protruding portion of the auxiliary line connection pattern 160, only a small amount of material discontinuously permeates due to the structural characteristics, and thus the organic film 180 is not stacked in a layered structure. Thus, a region, in which the cathode 190 deposited with excellent step coverage characteristics is directly connected to the auxiliary line 130 under the protruding portion UC of the auxiliary line connection pattern 160, is secured. Further, even when a small amount of material of the organic film 180 is introduced into a region or space below the protruding portion of the auxiliary line connection pattern 160, the organic functional layer 1210 provided in the emission area EA is separated from the material of the organic film 180 remaining on the auxiliary line 130 by the bump 140a, thereby preventing damage to the organic functional layer 1210 in the emission area EA and thus preventing deterioration of the sub-pixels. Accordingly, the electric connection between the auxiliary line 130 and the cathode 190 is stably realized below the protruding portion UC of the auxiliary line connection pattern 160. Here, the auxiliary line connection pattern 160 is formed in the same layer as the anode 1200 and includes transparent metal such as ITO, IZO or ITZO. Therefore, electric connection between the three metal layers, i.e. the cathode 190, the auxiliary line connection pattern 160 and the auxiliary line 130, is realized.

In the organic light-emitting display device according to the first aspect of the present disclosure, the bump 140a is formed of the same material as the first insulating film 140. The auxiliary line contact CTA is formed in the first insulating film 140 through an etching process, and the auxiliary line connection pattern 160 is formed. Thereafter, the bump 140a is formed during a secondary etching process for forming the first hole 140e in the first insulating film 140. Thus, the bump 140a may have a height equal or less than the height of the first insulating film 140.

Hereinafter, the method of manufacturing the construction above the auxiliary line 130, including the bump 140a, in the organic light-emitting display device according to the first aspect of the present disclosure will be described.

First, a first insulating film 140 is formed on an interlayer insulating film 120 having an auxiliary line 130, and is partially removed in order to form a second contact hole 140c.

Subsequently, a second insulating film 150 is formed on the first insulating film 140, and is partially removed in order to form a third hole 150e, which encompasses the second contact hole 140c and has a diameter greater than the diameter of a first hole 140e to be formed later.

A transparent electrode material is deposited and partially removed in order to form an auxiliary line connection pattern 160, which is connected to the auxiliary line 130 exposed through the second contact hole 140c. In this process, an anode 1200 may be formed so as to be connected to the driving thin-film transistor.

Subsequently, a bank 170 is formed so as to cover a portion of the auxiliary line connection pattern 160 and a portion of the anode 1200 and to expose the second hole 170e and the emission area therethrough. At this time, at least a portion of the auxiliary line connection pattern 160, as shown in FIG. 5, protrudes inwards within the second hole 170e in the bank 170.

Subsequently, the exposed portion of the first insulating film 140 is etched using a photosensitive film pattern (not shown), which is left behind on the bank 170, the emission area, the auxiliary line connection pattern 160 and the bump, as a mask. In this process, the first hole 140e is formed in the first insulating film 140 so as to expose the auxiliary line 130 therethrough. The first insulating film may be over-etched using an etchant such that the etchant permeates a portion of the region below the auxiliary line connection pattern 160, which is located below the photosensitive film pattern, whereby the first hole 140e may be formed so as to overlap the auxiliary line connection pattern 160. In addition, in this process, the bump 140a is formed below the photosensitive film pattern remaining within the first hole 140e. The bump 140a has a width less than the width of the photosensitive film pattern. In this case, after the etching process is completed and the photo-sensitive film pattern is removed, an ashing process may be additionally performed so that the height of the bump 140a becomes smaller than the height of the first insulating film 140. Alternatively, in the process of forming the photosensitive film pattern, the photosensitive film pattern may be formed with a relatively small height in the first hole 140e using a halftone mask or a diffraction exposure mask, whereby the height of the bump 140a may become smaller than the height of the first insulating film 140.

That is, in the organic light-emitting display device according to the first aspect of the present disclosure, the bump 140a is defined after the formation of the auxiliary line connection pattern 160, and has a second height h2 that is less than a first height h1 of the first insulating film 140. In the process of depositing the organic film 180 after the formation of the bank 170, the organic film 180 may be directly brought into contact with the surface of the bump 140a. Further, because the surface area is increased by the formation of the bump 140a, the organic film 180, which is deposited within the first hole 140e, is primarily deposited along the surface of the bump 140a, thereby preventing or minimizing permeation of the organic film material into the auxiliary line connection pattern 160. According to another aspect, the bump 140a may have a height equal to a height of the first insulating film 140. According to yet another aspect, the organic film 180 may be formed on an upper surface of the bump 140a in an island shape.

Compared to the organic film 180 deposited with straightness, the cathode 190, which is to be deposited later, has excellent step coverage characteristics and thus directly comes into contact with the upper, lower and lateral surfaces of the protruding portion of the auxiliary line connection pattern 160, which has a bent portion, and with the auxiliary line 130, which is exposed through a portion from which the first insulating film 140 of the auxiliary line connection pattern 160 is re-moved in the region further inward than the protruding portion of the auxiliary line connection pattern 160, whereby electric resistance of the cathode 190 is minimized through the connection between the cathode 190 and the auxiliary line 130 in each sub-pixel.

Further, as described above, since the organic film 180 is formed on the bank 170 having good flatness, it is possible to form the deposition structure of the organic film 180 and the cathode 190 on the bank 170.

Hereinafter, an organic light-emitting display device according to a comparative example, which does not include a bump, and problems related thereto will be described.

Figure 7:
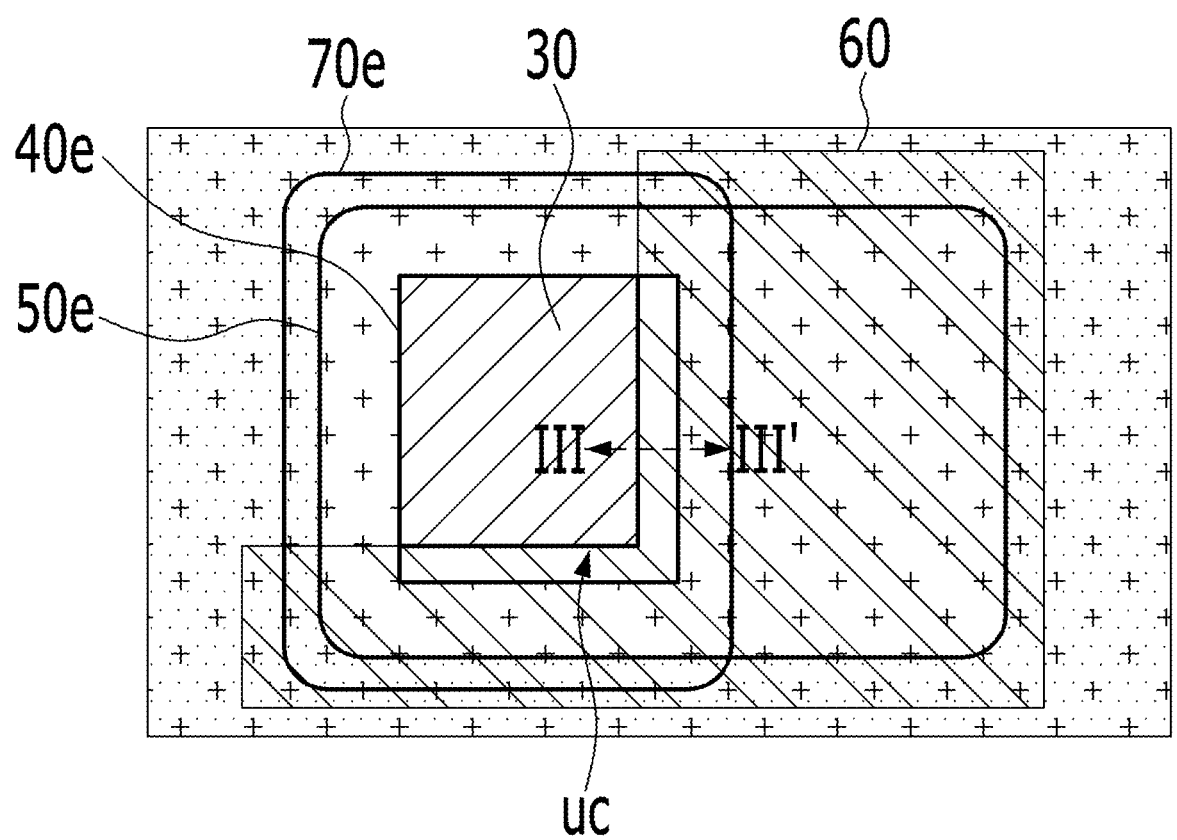
FIG. 7 is a plan view showing an organic light-emitting display device according to a comparative example.
Figure 8:
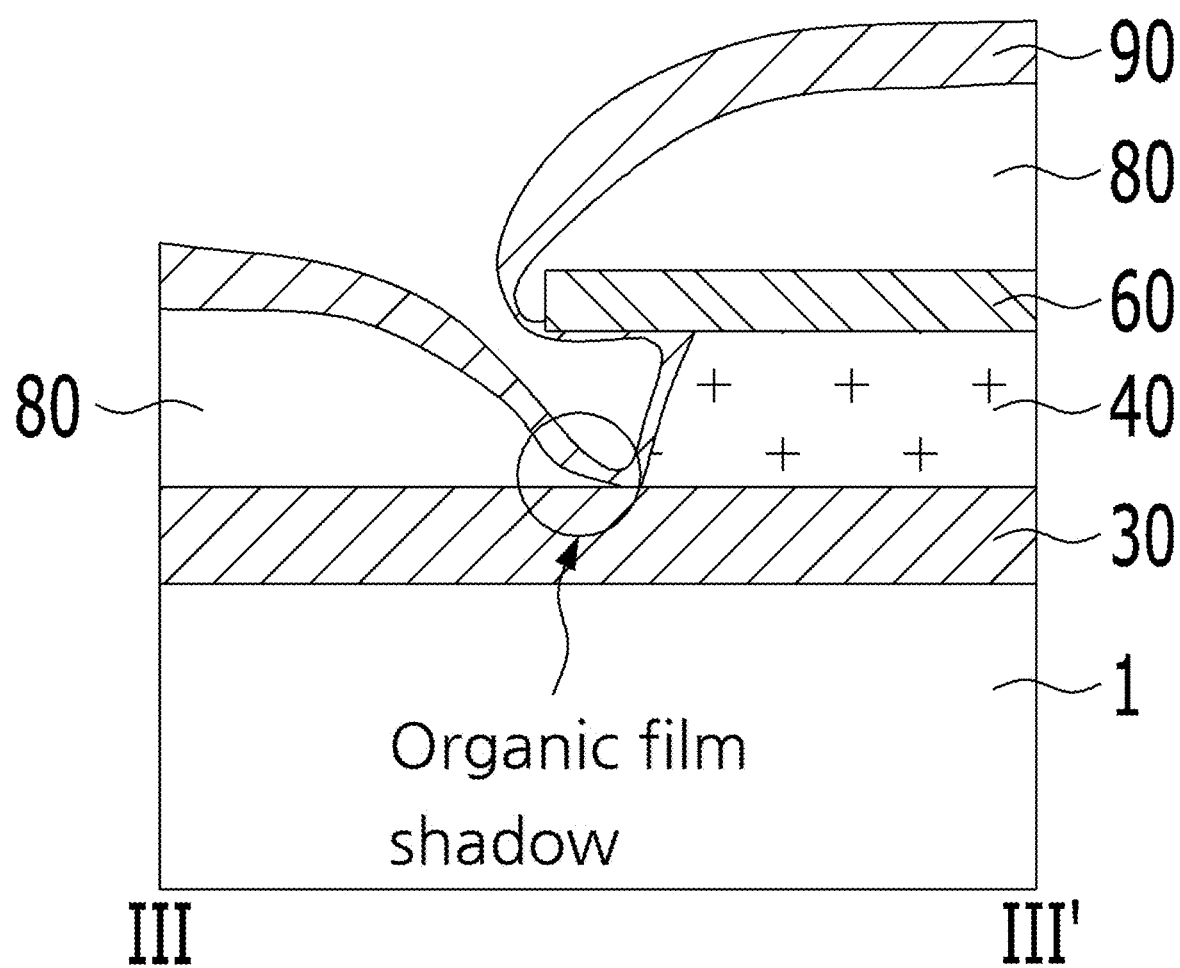
FIG. 8 is a cross-sectional view taken along line III-III' in FIG. 7.
Figure 9:
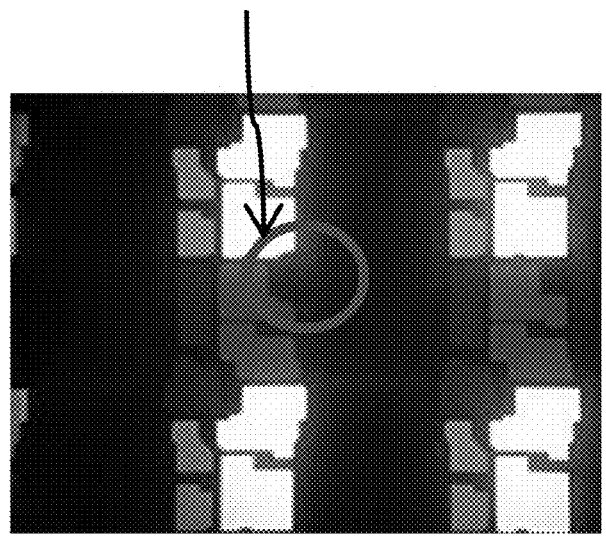
FIG. 9 is a picture showing defects of the organic light-emitting display device according to the comparative example.

FIG. 7 is a plan view showing the organic light-emitting display device according to a comparative example, and FIG. 8 is a cross-sectional view taken along line III-III' in FIG. 7. FIG. 9 is a picture showing defects of the organic light-emitting display device according to the comparative example.

As shown in FIGS. 7 and 8, the organic light-emitting display device according to the comparative example includes an auxiliary line 30 disposed on a substrate 1, a first insulating film 40 having therein a first hole 40e and disposed on the auxiliary line 30, and an auxiliary line connection pattern 60, a portion of which protrudes with respect to the first insulating film 40 through an undercut structure.

A second insulating film 50, which has therein a second hole 50e and is formed of a material having a different etching property from the first insulating film 40, is formed on the first insulating film 40, and a bank, which has therein a third hole 70e that is larger than the first hole 40e, is formed on the second insulating film 50.

The auxiliary line connection pattern 60 has a protruding portion, which partially overlaps at least a portion of the first hole 40e. Since the first insulating film 40 is not formed below the protruding portion, a vertical spacing is formed between the protruding portion and the auxiliary line 30.

In this case, in the process of depositing the organic film 80 after the formation of the bank, the organic film 80 is deposited on the auxiliary line connection pattern 60 having flatness as well as on the auxiliary line 30 exposed through the first hole 40e. At this time, the organic film 80 may be stacked on a portion of the auxiliary line 30, which has flatness and is hidden by the protruding portion of the auxiliary line connection pattern 60. This is referred to as an organic film (organic layer) shadow. If such an organic film shadow is generated, because the organic film 80 is connected to the auxiliary line 30 within the first hole 40e, deposition of the cathode 90 on the inside of the protruding portion of the auxiliary line connection pattern 60 is obstructed. Even though the cathode 90 is deposited, connection resistance between the cathode 90 and the auxiliary line 30 is excessively increased. In the case in which the contact resistance between the cathode 90 and the auxiliary line 30 becomes excessively high due to the organic film shadow, as shown in FIG. 9, the entire or a portion of the corresponding sub-pixel appears black. This is a main cause of deterioration in visual quality. Therefore, in order to solve this problem, the organic light-emitting display device according to the present disclosure is configured such that the bump 140a is disposed adjacent to the auxiliary line connection pattern 160.

Figure 10:
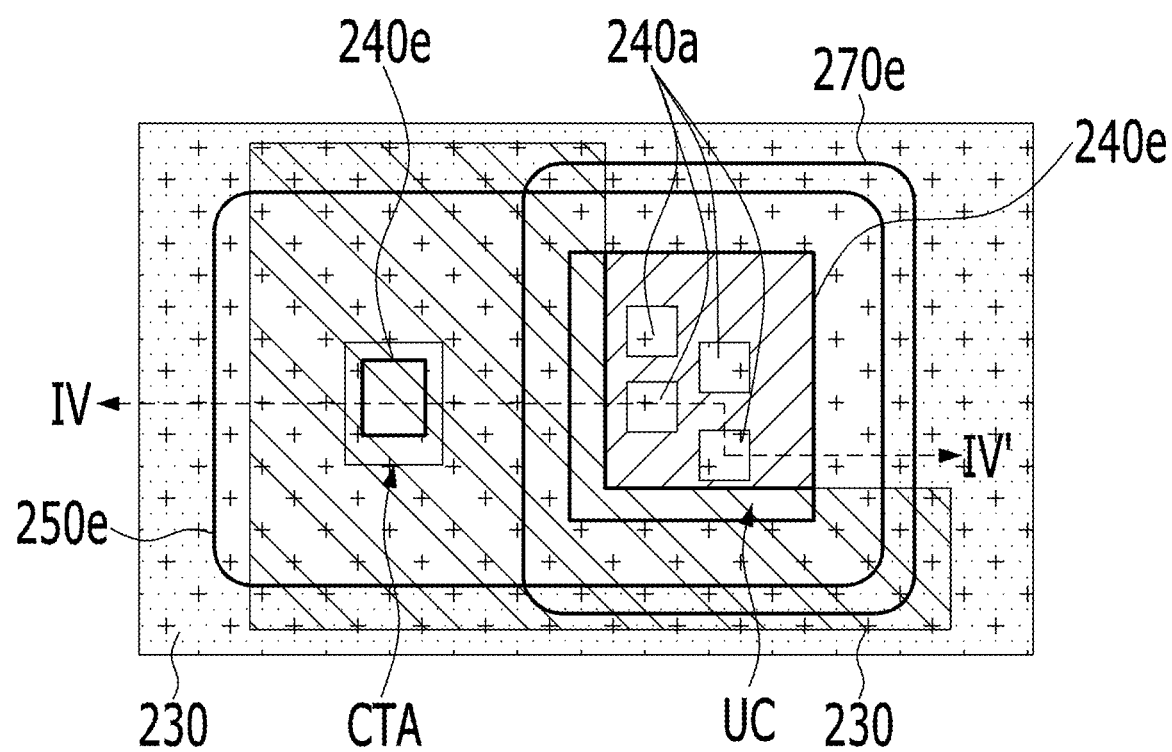
FIG. 10 is a plan view of an organic light-emitting display device according to a second aspect of the present disclosure.
Figure 11:
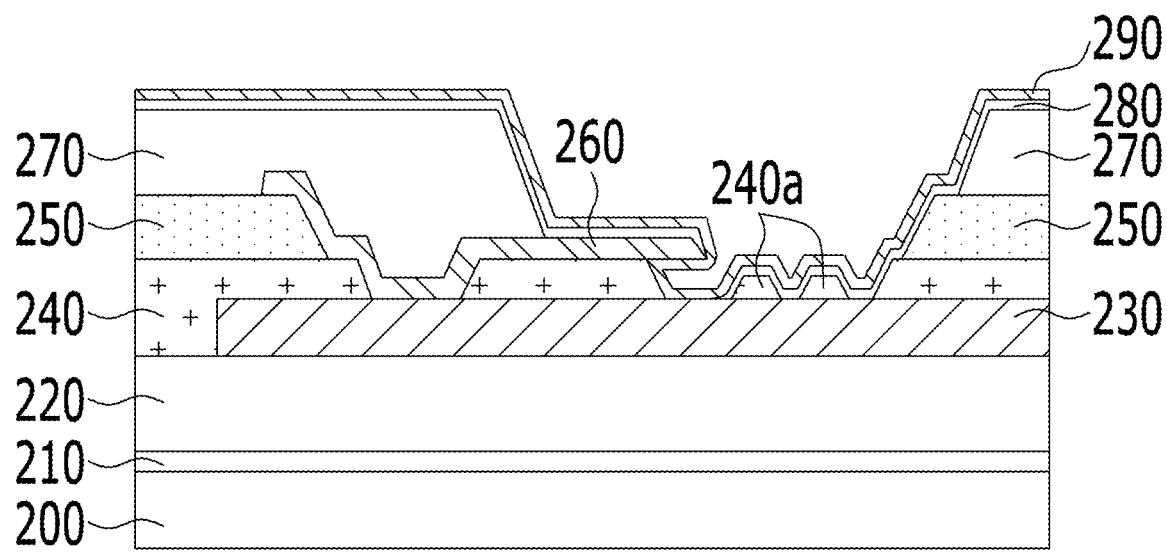
FIG. 11 is a cross-sectional view taken along line IV-IV' in FIG. 10.
Figure 12:
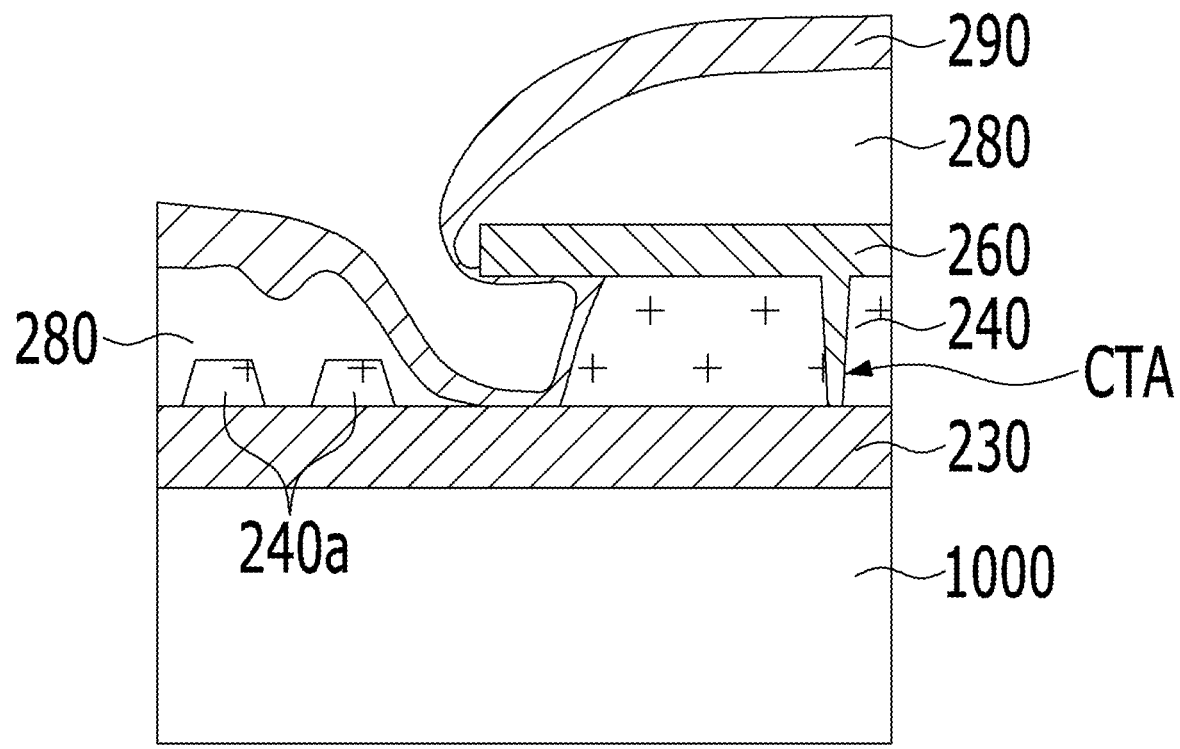
FIG. 12 is a cross-sectional view showing connection in an undercut region in the organic light-emitting display device according to the second aspect of the present disclosure.

FIG. 10 is a plan view of an organic light-emitting display device according to a second aspect of the present disclosure, and FIG. 11 is a cross-sectional view taken along line IV-IV' in FIG. 10. FIG. 12 is a cross-sectional view showing connection in an undercut region in the organic light-emitting display device according to the second aspect of the present disclosure.

As shown in FIGS. 10 and 11, the organic light-emitting display device according to the second aspect of the present disclosure differs from the first aspect in that a plurality of bumps 240a is provided, and is the same as the first aspect in that a first insulating film 240 having therein a first hole 240e is formed on an auxiliary line 230, in that a second insulating film 250 having therein a third hole 250e is provided, and in that an auxiliary line connection pattern 260 has an auxiliary line contact CTA in an overlapping region between the auxiliary line 230 and a bank 270. The bank 270 has therein a second hole 270e, which is larger than the first hole 240e, the auxiliary line connection pattern 260 protrudes with a certain width into the first hole 240e, and the bumps 240a are formed adjacent to the protruding portion of the auxiliary line connection pattern 260.

Among the bumps 240a, the bumps, which are located closest to the protruding portion of the auxiliary line connection pattern 260, are located within an interval of 5 μm from the auxiliary line connection pattern 260, thereby preventing an organic film 280 formed on the bumps 240a from permeating the protruding portion UC of the auxiliary line connection pattern 260.

Although the bumps 240a are illustrated as having the same size as each other, the present disclosure is not limited thereto. The sizes of the bumps 240a may differ in the respective regions. For example, if a possibility of permeation of the organic film into the corner portion of the auxiliary line connection pattern 260 is high, the bump 240a located in the region adjacent thereto may be formed to be larger than the bumps located in other regions.

Each of the bumps 240a may be formed in an island shape, or may be formed in a circular shape, an elliptical shape, a polygonal shape, or an irregular shape. The intervals at which the bumps 240a are located adjacent to the auxiliary line connection pattern 260 may be varied in the respective regions depending on the amount of organic film deposited.

As shown in FIG. 12, in the case in which the bumps 240a are provided, when the organic film 280 is deposited in the first hole 240e (Please see FIG. 10), the organic film 280 is primarily deposited on the surfaces of the bumps 240a due to the increase in the surface area in the first hole 240e by the formation of the bumps 240a, thereby preventing the organic film 280 from being deposited on a region below the protruding portion UC of the auxiliary line connection pattern 260. Thereafter, when the cathode 290, which is formed of a metal material having excellent step coverage characteristics, is deposited on the region below the protruding portion of the auxiliary line connection pattern 260, whereby the cathode 290 is directly connected to the auxiliary line 230 in the region below the protruding portion. Further, since the protruding portion has a width of about 2 to 5 μm, the cathode 290 and the auxiliary line 230 are stably connected to each other in a corresponding sub-pixel, and the resistance is minimized at the connection portion.

Unexplained reference numeral 1000 denotes a substrate, which is disposed below the auxiliary line 230 and which includes a buffer layer (210 in FIG. 11), an interlayer insulating film (220 in FIG. 11), and a thin-film transistor array, which includes a gate line (not shown), a semiconductor layer and a gate insulating film.

Figure 13:
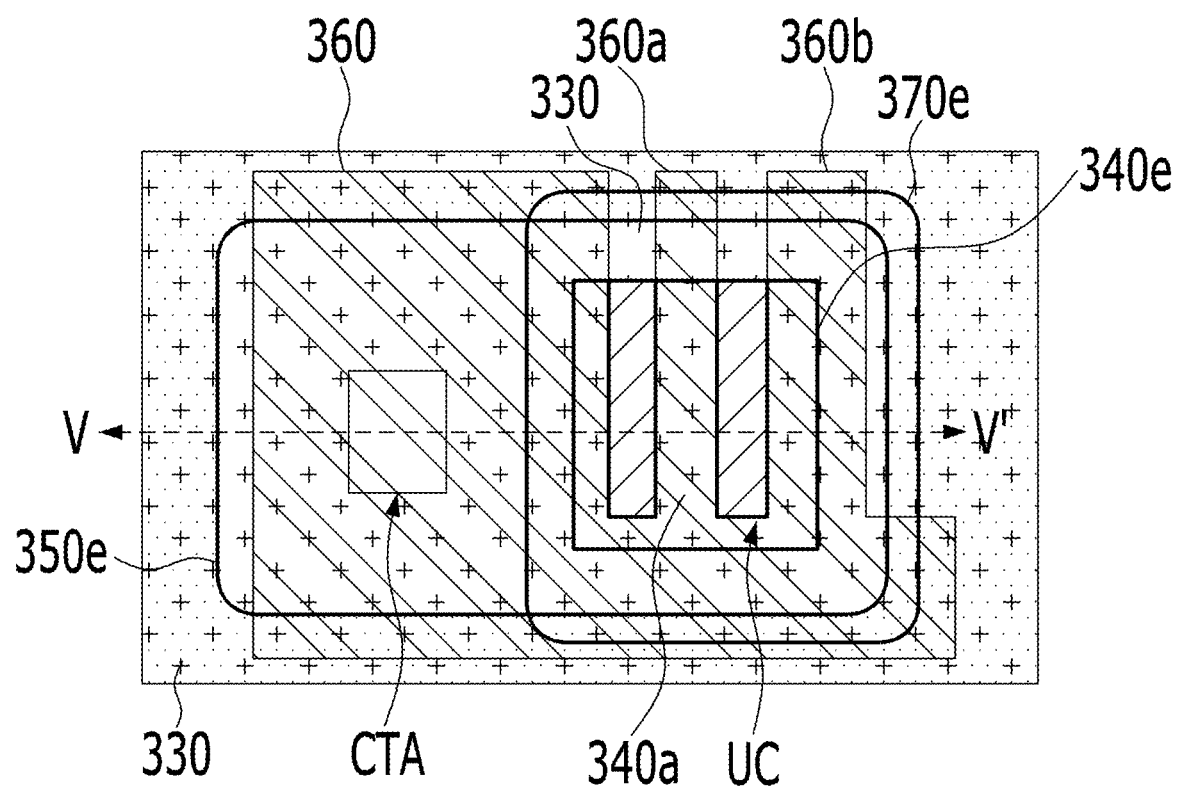
FIG. 13 is a plan view of an organic light-emitting display device according to a third aspect of the present disclosure.
Figure 14:
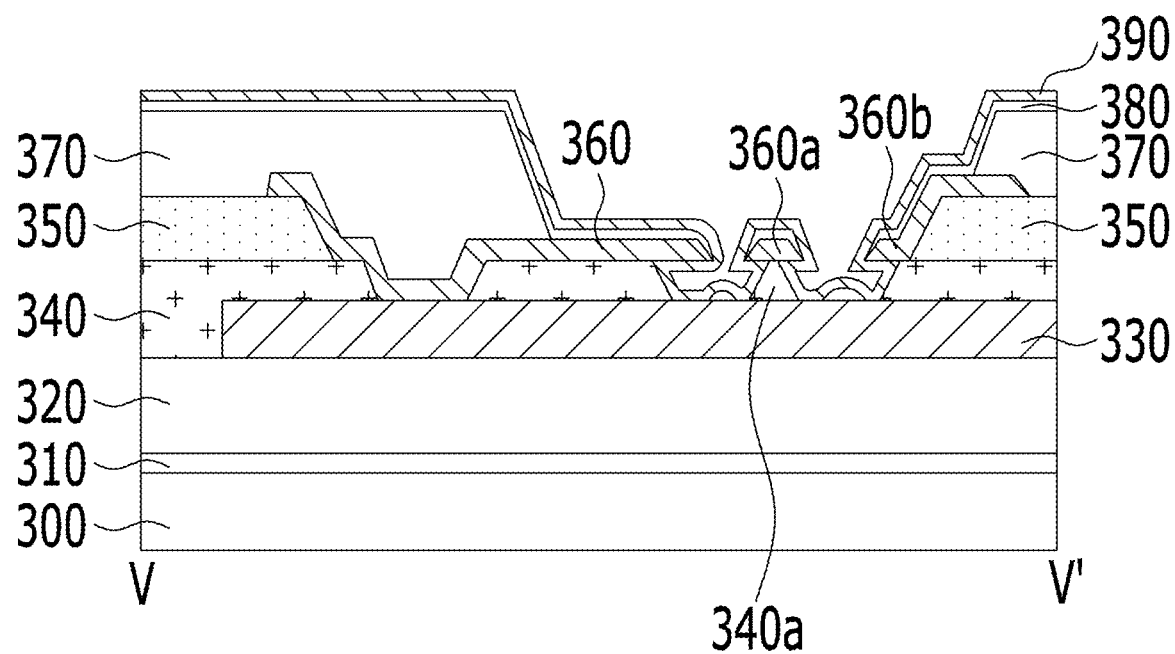
FIG. 14 is a cross-sectional view taken along line V-V' in FIG. 13.

FIG. 13 is a plan view of an organic light-emitting display device according to a third aspect of the present disclosure, and FIG. 14 is a cross-sectional view taken along line V-V' in FIG. 13.

As shown in FIGS. 13 and 14, the organic light-emitting display device according to the third aspect of the present disclosure differs from the first aspect in that a bump 340a has the same height as the first insulating film 340 and in that a first divergence portion 360a of the auxiliary line connection pattern 360 is additionally formed on the bump 340a.

In addition to the first divergence portion 360a, the auxiliary line connection pattern 360 may further include a second divergence portion 360b, which is integrally connected therewith and which is located at a side of the first hole 340e, other than the sides thereof surrounded by the auxiliary line connection pattern 360. Due to the integral connection structure of the auxiliary line connection pattern 360 and the first and second divergence portions 360a and 360b, the cathode 390 overlaps the auxiliary line connection pattern 360 and the first and second divergence portions 360a and 360b around the first hole 340e, and thus the contact area between the auxiliary line 330 and the cathode 390 below the protruding portion UC is further increased than in the aspects described above, thereby further minimizing the resistance due to the increase in the contact area.

The organic light-emitting display device according to the third aspect of the present disclosure is the same as the first aspect in that a first insulating film 340 having therein a first hole 340e is formed on an auxiliary line 330, in that a second insulating film 350 having therein a third hole 350e is provided, and in that an auxiliary line connection pattern 360 has an auxiliary line contact CTA in an overlapping region between the auxiliary line 330 and a bank 370. The bank 370 has therein a second hole 370e, which is larger than the first hole 340e, the auxiliary line connection pattern 360 protrudes with a certain width into the first hole 340e, and the bump 340a are formed adjacent to the protruding portion of the auxiliary line connection pattern 360.

Unlike the first and second aspects described above, a horizontal spacing may be formed between the bump 340a and the protruding portion of the auxiliary line connection pattern 360.

The bump 340a is etched in the same process as forming the auxiliary line connection pattern 360 and the first and second divergence portions 360a and 360b, and is formed using a transparent electrode constituting the auxiliary line connection pattern 360 and using the first insulating film 340 formed of an insulating film material having a high etching rate. Thus, the bump 340a has a different etching rate from the auxiliary line connection pattern 360 and the first and second divergence portions 360a and 360b due to the difference in the material. After the completion of etching, the upper surface of the bump 340a has a smaller width than the first divergence portion 360a disposed thereon. In this process, because the first divergence portion 360a, which is an upper element, is left behind, the bump 340a has the same height as the first insulating film 340.

The first divergence portion 360a may have a protruding portion, which radially or laterally protrudes from the upper surface of the bump 340a.

In this case, in the process of forming the organic film 380 after the formation of the bank 370, the organic film 380 covers the first divergence portion 360a, which is left behind on the bump 340a, in an island shape. In this process, in the case in which a horizontal spacing is present between the bump 340a and the auxiliary line connection pattern 360, the organic film 380 is left behind in this region.

The cathode 390 is formed on the region in which the organic film 380 is left behind, on the region below the auxiliary line connection pattern 360 and the first and second divergence portions 360a and 360b, in which the organic film 380 is not formed, and on the auxiliary line 330 hidden by the protruding portion, thereby enabling connection between the cathode 390 and the auxiliary line 330.

Hereinafter, various modifications of the organic light-emitting display device according to the present disclosure will be described with reference to plan views.

Figure 15:
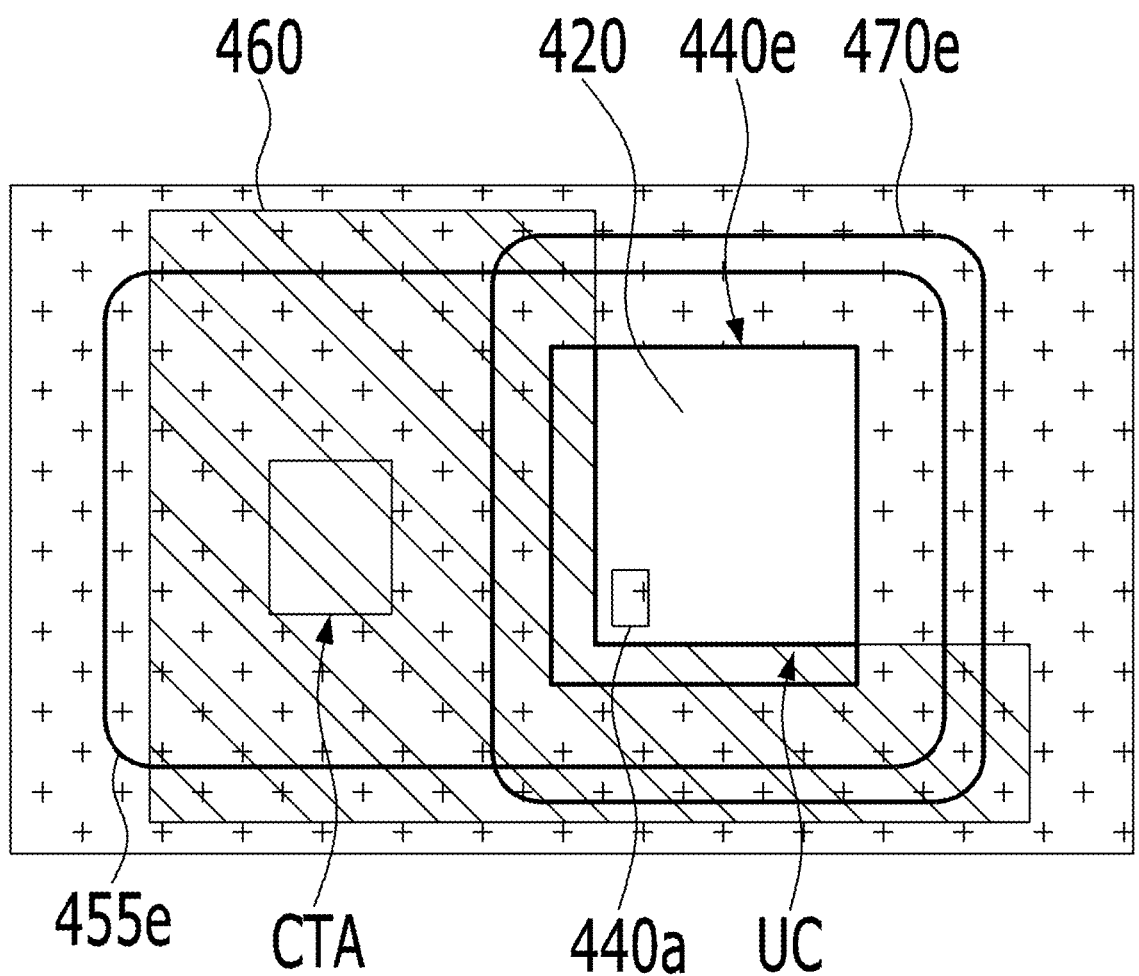
FIG. 15 is a plan view showing an organic light-emitting display device according to a fourth aspect of the present disclosure.

FIG. 15 is a plan view showing an organic light-emitting display device according to a fourth aspect of the present disclosure.

The organic light-emitting display device according to the fourth aspect of the present disclosure shown in FIG. 15 includes a first insulating film (first insulating film 140 in FIG. 6) having therein a first hole 440e, which is described above in the first aspect, an auxiliary line connection pattern 460, which has a protruding portion overlapping the first hole 440e in an "L" shape, an auxiliary line 420, and an auxiliary line contact CTA.

Here, a bump 440a is located adjacent to the corner of the auxiliary line connection pattern 460. The reason for this is to prevent an organic film shadow at the corner of the organic film, which is caused by higher permeation characteristics of the corner of the organic film than the other regions thereof.

Unexplained reference numeral 455e denotes a third hole (refer to 150e in FIG. 6) in a second insulating film formed on the first insulating film, and reference numeral 470e denotes a second hole 470e in a bank formed on the second insulating film.

Figure 16:
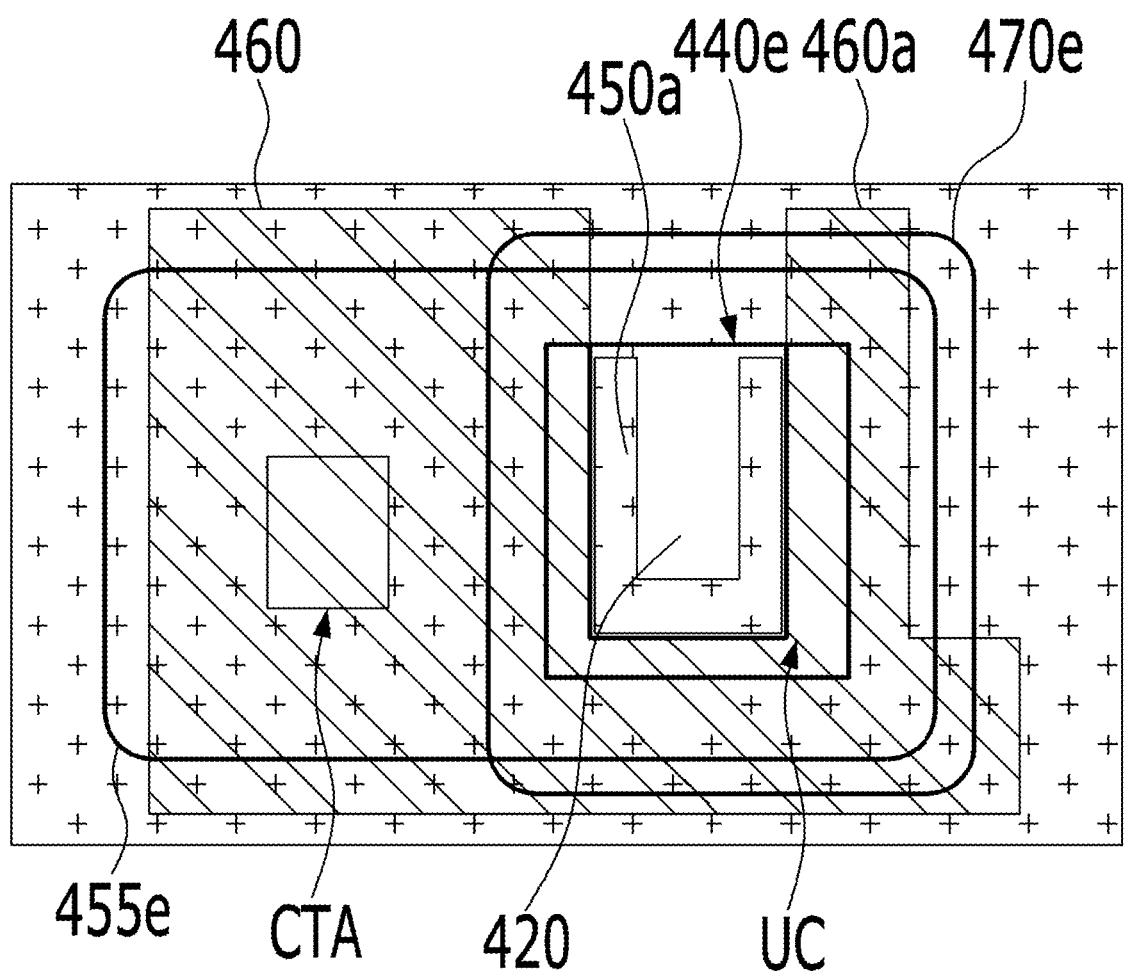
FIG. 16 is a plan view showing an organic light-emitting display device according to a fifth aspect of the present disclosure.

FIG. 16 is a plan view showing an organic light-emitting display device according to a fifth aspect of the present disclosure.

As shown in FIG. 16, the organic light-emitting display device according to the fifth aspect of the present disclosure differs from the fourth aspect in that an auxiliary line connection pattern 460 further includes a first divergence portion 460a partially overlapping the opposite side of a first hole 440e in a first insulating film. A bump 450a has a "U" shape so as to be adjacent to the protruding portion UC of the auxiliary line connection pattern 460 overlapping the first hole 440e. In detail, with this structure, it is possible to prevent an organic film from being deposited on the inside of the protruding portion of the auxiliary line connection pattern 460, which is adjacent to the bump 450a, thereby lowering contact resistance between the auxiliary line connection pattern 460 and the auxiliary line 420.

Figure 17:
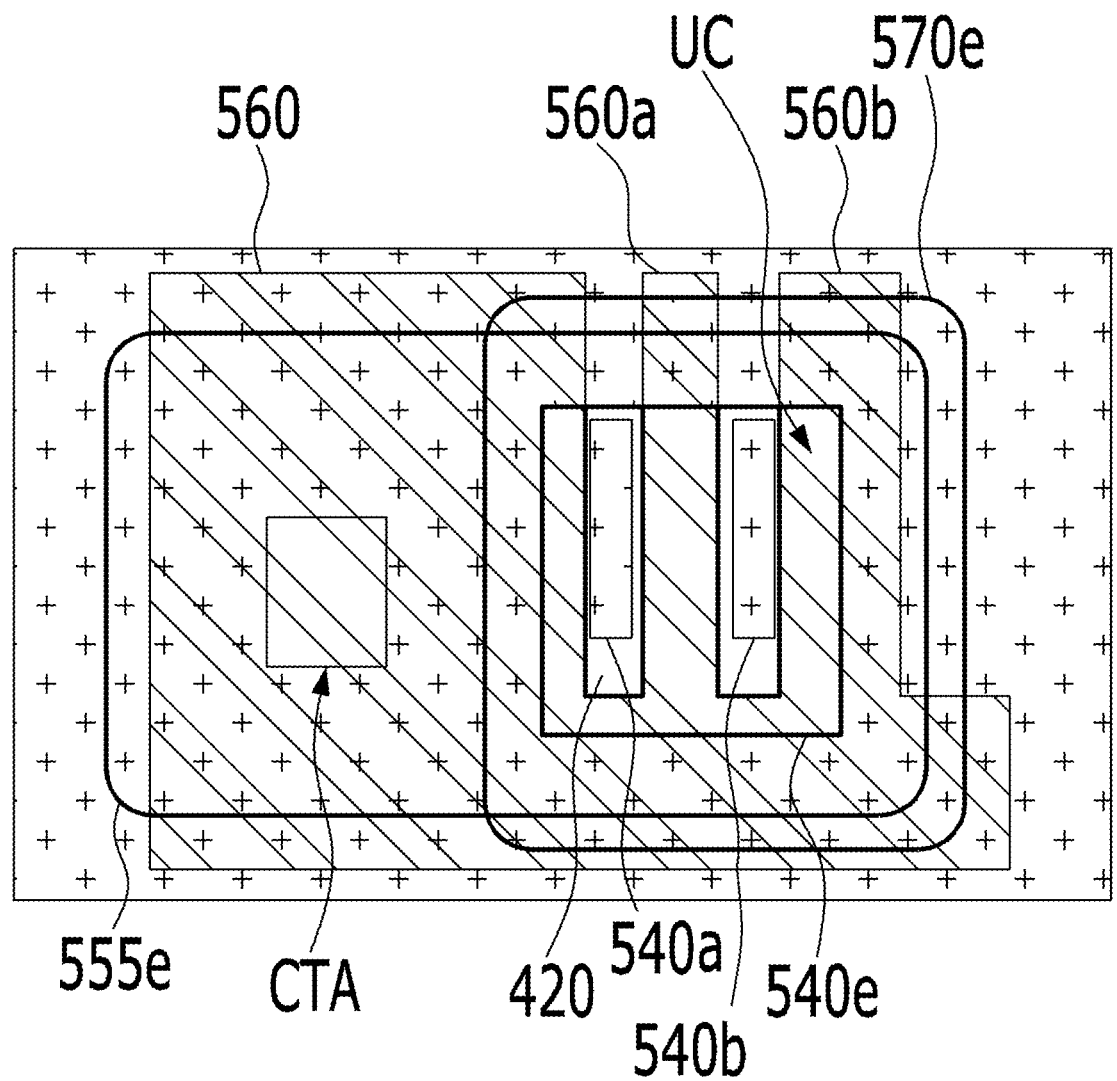
FIG. 17 is a plan view showing an organic light-emitting display device according to a sixth aspect of the present disclosure.

FIG. 17 is a plan view showing an organic light-emitting display device according to a sixth aspect of the present disclosure.

As shown in FIG. 17, the organic light-emitting display device according to the sixth aspect of the present disclosure differs from the fourth aspect in that an auxiliary line connection pattern 560 further includes a first divergence portion 560b partially overlapping the opposite side of a first hole 540e in a first insulating film and a second divergence portion 560a formed between the auxiliary line connection pattern 560 and the first divergence portion 560b so as to be parallel thereto. In addition, a first bump 550a is formed between the auxiliary line connection pattern 560 and the second divergence portion 560a, and a second bump 550b is formed between the second divergence portion 560a and the first divergence portion 560b. The second divergence portion 560a may be formed on a third bump formed between the first bump 550a and the second bump 550b (not shown). With this structure, it is possible to prevent an organic film from being deposited on the inside of the protruding portion of the auxiliary line connection pattern 660, which is adjacent to the first and second bumps 550a and 550b, thereby lowering contact resistance between the auxiliary line connection pattern 560 and the auxiliary line 420.

Unexplained reference numeral 570e denotes a second hole in a bank formed on the second insulating film.

The construction of the aspects, which was not described, is the same as that of the first aspect described above.

As is apparent from the above description, the organic light-emitting display device according to the present disclosure has the following effects.

First, when an auxiliary line and a cathode are connected to each other through an undercut structure of an auxiliary line connection pattern formed therebetween, a bump, which is adjacent to the auxiliary line connection pattern, is provided on an auxiliary line, whereby the bump prevents an organic film from permeating the undercut during the formation of an organic light-emitting diode and consequently stabilizing connection between the cathode and the auxiliary line below the undercut.

Second, the bump is formed as an insulating film, which is located below the auxiliary line connection pattern defining the undercut, thereby lowering contact resistance between the cathode and the auxiliary line without an additional process.

Third, a divergence portion, which diverges from the auxiliary line connection pattern, is provided on the upper surface of the bump, thereby increasing the contact area between the auxiliary line and the cathode and consequently minimizing the resistance of the cathode.

Fourth, it is possible to prevent an organic film shadow in the undercut structure by using the bump, thereby preventing a brightness deviation in the respective areas through the reliable connection between the cathode and the auxiliary line and improving visual quality.

The features, structures and effects and the like described in association with the aspects above are incorporated into at least one aspect of the present disclosure, but are not limited only to the one aspect. Furthermore, the features, structures and effects and the like exemplified in association with respective aspects can be implemented in other aspects by combination or modification by those skilled in the art. Therefore, contents related to such combinations and modifications should be construed as falling within the scope of the present disclosure.

In addition, while the present disclosure has been particularly described with reference to exemplary aspects, the present disclosure is not limited thereto. It will be understood by those skilled in the art that various modifications and applications, which are not illustrated above, may be made without departing from the scope of the present disclosure. For example, each component illustrated in the aspects may be modified and made.

What is claimed is:

1. An organic light-emitting display device comprising:
   a substrate comprising a plurality of sub-pixels, each of the sub-pixels having an emission area and a non-emission area provided to surround the emission area;
   an auxiliary line disposed in the non-emission area;
   a first insulating film having a first hole configured to expose a portion of the auxiliary line;
   an auxiliary line connection pattern disposed on the first insulating film having a protruding portion protruding towards a center of the first hole and overlapping the auxiliary line;
   at least one bump disposed on the auxiliary line within the first hole and adjacent to the protruding portion of the auxiliary line connection pattern, the at least one bump being spaced apart from the first insulating film; and
   a bank having a second hole larger than the first hole to expose the protruding portion of the auxiliary line connection pattern,
   wherein the first insulating film includes an inorganic film and the at least one bump includes a same material as the first insulating film.

2. The organic light-emitting display device according to claim 1, further comprising a cathode configured to be directly connected to the auxiliary line within a space under the protruding portion of the auxiliary line connection pattern.

3. The organic light-emitting display device according to claim 2, further comprising an organic film between the bank and the cathode.

4. The organic light-emitting display device according to claim 3, further comprising an anode disposed in a same layer as the auxiliary line connection pattern and an organic functional layer disposed in a same layer as the organic film in the emission area,
   wherein the anode, the organic functional layer and the cathode are sequentially stacked in the emission area and form an organic light-emitting diode.

5. The organic light-emitting display device according to claim 2, further comprising an organic film in an island shape disposed on an upper surface of the at least one bump, wherein the cathode covers the organic film on the upper surface of the at least one bump.

6. The organic light-emitting display device according to claim 5, wherein the at least one bump has a flat upper surface and tapered lateral surface.

7. The organic light-emitting display device according to claim 6, wherein a thickness of the organic film on the flat upper surface of at least one bump is thicker than a thickness of the organic film on the tapered lateral surface of at least one bump.

8. The organic light-emitting display device according to claim 1, wherein the at least one bump has a smaller height than the first insulating film.

9. The organic light-emitting display device according to claim 1, wherein the at least one bump has a same height as the first insulating film.

10. The organic light-emitting display device according to claim 9, further comprising an auxiliary electrode divergence portion diverging from the auxiliary line connection pattern and provided on the at least one bump.

11. The organic light-emitting display device according to claim 10, wherein the auxiliary electrode divergence portion laterally protrudes from an upper surface of the at least one bump.

12. The organic light-emitting display device according to claim 10, wherein the auxiliary line connection pattern is located at at least two sides of the first hole and the auxiliary line connection pattern comprises an additional divergence portion located at a side the other side from the two sides of the first hole.

13. The organic light-emitting display device according to claim 1, further comprising a connection portion between the auxiliary line and the auxiliary line connection pattern, wherein the connection portion penetrates the first insulating film in a region where the connection portion overlaps the bank.

14. The organic light-emitting display device according to claim 13, further comprising a second insulating film disposed between the first insulating film and the bank,
   wherein the second insulation film has a third hole exposing the connection portion and the first hole.

15. The organic light-emitting display device according to claim 14, wherein the second insulating film includes an organic film.

16. The organic light-emitting display device according to claim 1, wherein the at least one bump is laterally spaced apart from the auxiliary line connection pattern within an interval of about 5 µm.

17. An organic light-emitting display device comprising:
   a substrate comprising a plurality of sub-pixels, each of the sub-pixels having an emission area and a non-emission area surrounding the emission area;
   an auxiliary line disposed in the non-emission area;
   a first insulating film having a first hole exposing a portion of the auxiliary line;
   an island shape bump disposed on the auxiliary line within the first hole;
   an auxiliary line connection pattern having an overhanging portion and disposed in close proximity to the island shape bump; and
   a cathode connecting with the auxiliary line in a space between the overhanging portion of the auxiliary line connection pattern and the auxiliary line,
   wherein the first insulating film includes an inorganic film and the island shape bump includes a same material as the first insulating film.

18. The organic light-emitting display device according to claim 17, further comprising an auxiliary electrode divergence portion diverging from the auxiliary line connection pattern and provided on the island shape bump.

19. The organic light-emitting display device according to claim 18, wherein the auxiliary electrode divergence portion laterally protrudes from an upper surface of the island shape bump.

20. The organic light-emitting display device according to claim 18, wherein the auxiliary line connection pattern is located at at least two sides of the first hole and the auxiliary line connection pattern comprises an additional divergence portion located at other side from the two sides of the first hole.

21. The organic light-emitting display device according to claim 17, further comprising a connection portion between connecting with the auxiliary line and the auxiliary line connection pattern, wherein the connection portion penetrates the first insulating film in a region where the connection portion overlaps a bank.

* * * * *